(12) United States Patent
Cortese

(10) Patent No.: US 8,385,845 B1
(45) Date of Patent: Feb. 26, 2013

(54) SHUNT DEVICE FOR SWITCH

(75) Inventor: Philippe Cortese, Longwood, FL (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 536 days.

(21) Appl. No.: 12/577,101

(22) Filed: Oct. 9, 2009

(51) Int. Cl.
 *H04B 1/44* (2006.01)
(52) U.S. Cl. .................. 455/78; 455/79; 455/83
(58) Field of Classification Search .............. 455/78, 455/83, 79–82; 370/278, 282
 See application file for complete search history.

(56) References Cited

U.S. PATENT DOCUMENTS

2006/0252394 A1* 11/2006 Suwa et al. .............. 455/201
2007/0290744 A1* 12/2007 Adachi et al. ............ 330/51

* cited by examiner

*Primary Examiner* — Nay A Maung
*Assistant Examiner* — Angelica Perez
(74) *Attorney, Agent, or Firm* — Schwabe Williamson & Wyatt

(57) ABSTRACT

Embodiments include but are not limited to apparatuses and systems including a first active device located on a signal path between an antenna terminal and a transmit and/or receive (T/R) terminal, and a self-biasing shunt device coupled to the first active device and including a second active device having a DC-blocked source terminal and a non-DC-blocked drain terminal. Other embodiments may be described and claimed.

20 Claims, 5 Drawing Sheets

400

Couple a first active device between an antenna terminal and a T/R terminal
402

Couple a self-biasing shunt device to the first active device, the self-biasing shunt device including a second active device having a DC-blocked source terminal and a non-DC blocked drain terminal
404

Provide a first active device on a signal path between an antenna terminal and a T/R terminal
502

Directly couple a non-DC blocked drain terminal of a second active device of a self-biasing shunt device to a gate terminal of the first active device
504

Isolate the antenna terminal from the T/R terminal by switching off the first active device
506

Shunt a signal on the signal path to a local ground terminal coupled to the self-biasing shunt device by switching on the second active device
508

Figure 5

SHUNT DEVICE FOR SWITCH

TECHNICAL FIELD

Embodiments of the present invention relate generally to microelectronic devices and more particularly to shunt devices, and circuits incorporating such shunt devices.

BACKGROUND

High-power field-effect transistor (FET) switches are commonly used in radio-frequency/microwave circuits in wireless communications and radar systems. For high-power switching, FET switches are often either biased or include shunt devices for providing isolation of signal paths. Although these shunt devices provide isolation, the shunt devices also tend to increase circuit complexity, die-area consumption, and cost.

Refer, for example, to the switch 100 and a self-biasing shunt device 102 illustrated in FIG. 1. The shunt device 102 includes an active device 104 having a DC-blocked source terminal 106 and a DC-blocked drain terminal 108. The DC blocking is provided by a first capacitor 110 and a second capacitor 112, respectively. The drain terminal 108 of the active device 104 is coupled to the source of the last active device 126 of the series-stacked FETs on the signal path 114 between the antenna terminal 116 and the transmit/receive terminal 118. The drain terminal 108 of the active device 104 is also coupled by way of a resistor 120 to a control line 122 coupled to the control terminal 124.

In this configuration, two capacitors are required for DC-blocking the active device 104 of the shunt device 102. Not only do capacitors tend to be relatively large (compared to other passive devices, for example), but capacitors can also tend to be sensitive to electrostatic discharge.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 4 is a flow diagram of some of the operations associated with making a switch including a shunt device in accordance with various embodiments.

FIG. 5 is a flow diagram of some of the operations associated with using a switch including a shunt device in accordance with various embodiments.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

Figure 1:
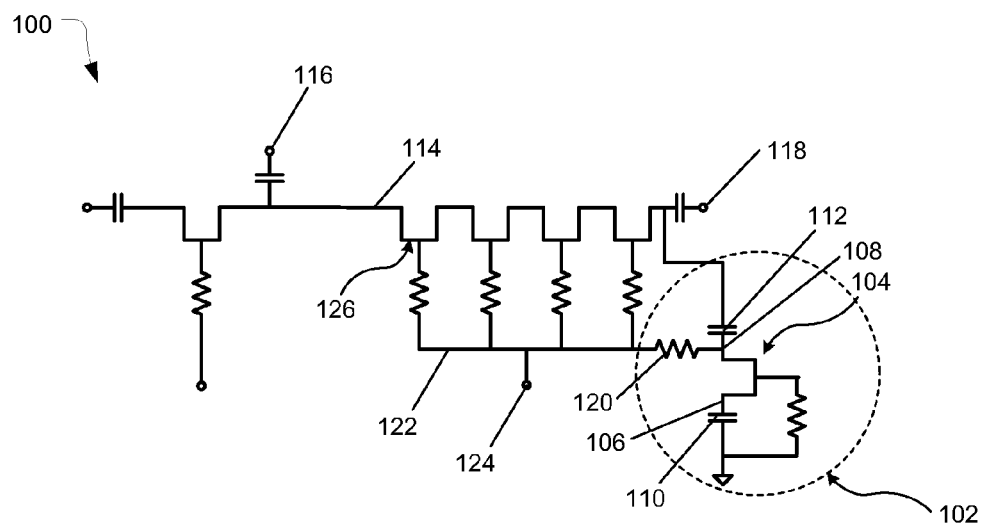
FIG. 1 is a circuit diagram of a switch including a related art shunt device.
Figure 2:
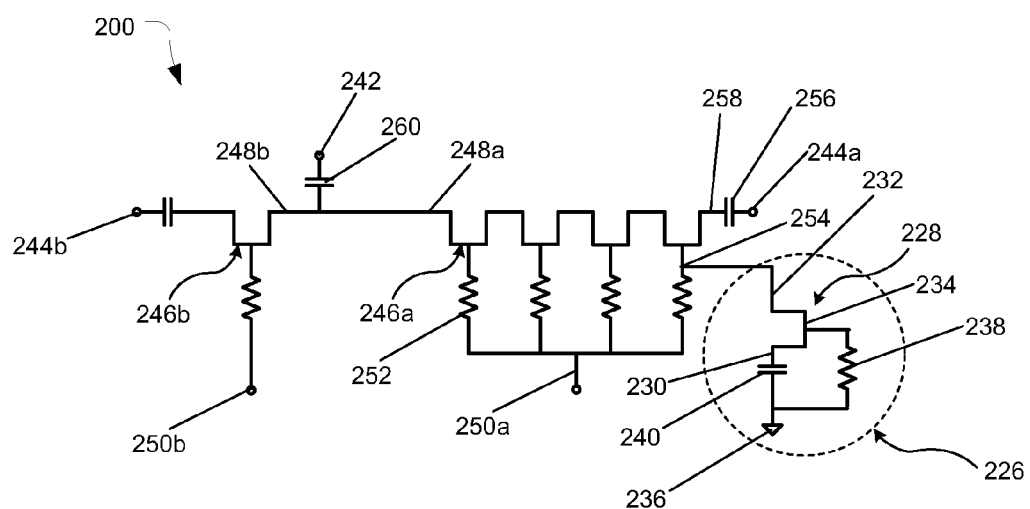
FIG. 2 is a circuit diagram of a switch including a shunt device in accordance with various embodiments.

Turning now to FIG. 2, illustrated is a circuit diagram of a switch 200 including a shunt device 226 in accordance with various embodiments. The shunt device 226 is self-biasing and includes an active device 228 having a DC-blocked source terminal 230 and a non-DC-blocked drain terminal 232.

By providing the shunt device 226 with a non-DC-blocked drain terminal 232, one less capacitor is used relative to conventional shunt devices that require both source and drain DC-blocking capacitors. This elimination of a capacitor results in a reduction in the consumption of die area, and this area savings is particularly significant considering that devices typically include many shunt devices. Moreover, the electrostatic discharge problem sometimes associated with the capacitor used for DC-blocking the drain terminal in conventional shunt devices is avoided by the elimination of the capacitor.

Referring again to FIG. 2, the active device 228 of the shunt device 226 further includes a gate terminal 234. The gate terminal 234 and the DC-blocked source terminal 230 are coupled with a local ground terminal 236. A resistor 238 may be connected between the gate terminal 234 and the local ground terminal 236, and a DC-blocking capacitor 240 may be connected between the DC-blocked source terminal 230 and the local ground terminal 236.

The switch 200 is a single-pole, dual-throw switch, including an antenna terminal 242 connected between a first transmit and/or receive (T/R) terminal 244a and a second transmit and/or receive (T/R) terminal 244b. The terminals 244a, 244b may be configured to transmit signals, receive signals, or both, to/from the antenna terminal 242.

In operation, one of the T/R terminals 244a, 244b may be selectively isolated from the other one of the T/R terminals 244a, 244b and the antenna terminal 242 by switching off active device(s) 246a, 246b on the signal path 248a, 248b between the antenna terminal 242 and T/R terminal 244a, 244b to be isolated. For example, the first T/R terminal 244a may be isolated from the second T/R terminal 244b and the antenna terminal 242 by switching off the active device 246a on the first signal path 248a between the antenna terminal 242 and the first T/R terminal 244a. The active devices 246a, 246b are selectively switched on and off by application of a control signal to the gate(s) of the active devices 246a, 246b by way of the control terminals 250a, 250b. Once one of the T/R terminals 244a, 244b is isolated, transmission or reception of signals between the antenna terminal 242 and the non-isolated T/R terminal 244a, 244b may proceed.

As illustrated, the switch 200 is a field effect transistor (FET)-based switch in which the active devices 246a, 246b comprise FETs. Although the illustrated embodiment depicts the switch 200 as being implemented using four FETs stacked in series located on the first signal path 248a, and one FET located on the second signal path 248b, any number of FETs may be used. In various embodiments, the number of FETs on each signal path may be symmetrical (i.e., there would be the same number of FETs on each of the first signal path and the second signal path) (not illustrated). The gate terminal(s) of the FET active device(s) 246a, 246b are coupled to the control terminals 250a, 250b, usually by way of one or more resistors 252, for switching. In other embodiments, transistors other than FETs may be used.

As illustrated, the non-DC-blocked drain terminal 232 of the shunt device 226 is connected directly, without any intervening circuit elements, to the gate terminal of one of the active devices 246a on the first signal path 248a, so that when the active device(s) 246a on the first signal path 248a are switched off, the shunt device 226 is switched on, and vice versa, at least because control signals provided by the control terminals 250a, 250b are provided simultaneously to both the gate terminal of the one of the active devices 246a and to the non-DC-blocked drain terminal 232 of the shunt device 226. In various embodiments, the non-DC-blocked drain terminal 232 and a gate terminal of one of the active devices 246a may be directly coupled to each other at a node 254.

As the non-DC-blocked drain terminal 232 is connected directly to the gate terminal of an active device 246a on the first signal path 248a, one less resistor is used relative conventional shunt devices, which connect drain terminals to control terminals through an additional resistor. Thus, the shunt device 226 includes half the number of capacitors and resistors as that used in a conventional shunt device.

The switch 200 may further include at least one capacitor 256 between one or both of the T/R terminals 244a, 244b and the source terminal 258 of the last active device 246a, 246b (i.e., the active device 246a, 246b farthest from the antenna terminal 242) of the signal paths 248a, 248b. The capacitor 256 may be configured with a capacitance as needed to regulate harmonics on the signal paths 248a, 248b. In various embodiments, the capacitor 256 may have a capacitance anywhere from 10.5 to 17 picofarads. The switch 200 may also include a capacitor 260 on the antenna terminal 242, as illustrated.

Figure 3:
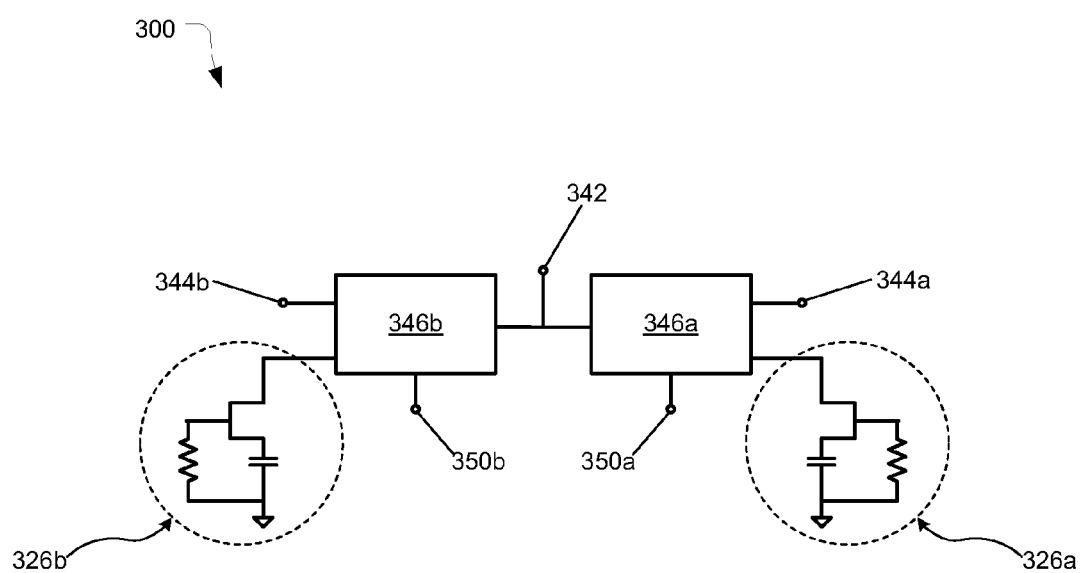
FIG. 3 is a circuit diagram of another switch including shunt devices in accordance with various embodiments.

As illustrated in FIG. 3, shunt devices described herein may be implemented in switches of various configurations. A switch 300 may include multiple shunt devices 326a, 326b, at least one shunt device 326a, 326b being coupled to active device(s) 346a, 346b on a signal path between an antenna terminal 342 and T/R terminals 344a, 344b. As in embodiments described elsewhere, each set of active devices 346a, 346b may be selectively controlled (e.g., switched on and off) by a switching signal by way of control terminals 350a, 350b.

Turning now to FIG. 4, illustrated is a flow diagram of some of the operations associated with an example method 400 of making a switch including a shunt device in accordance with various embodiments described herein. It should be noted that although the method 400 is illustrated as a series of sequential steps, the method is not necessarily order dependent. Moreover, methods within the scope of this disclosure may include more or fewer steps than that illustrated in FIG. 4.

According to various embodiments, a first active device on a signal path may be coupled between an antenna terminal and a T/R terminal at block 402. Although not illustrated, in some embodiments, a method for making a switch including a shunt device may further include coupling at least a third active device in series with the first active device on the signal path between the antenna terminal and the T/R terminal. The active devices may comprise one or more FETs. Although not illustrated, the gate terminal(s) of the FET active device(s) may be coupled to a control terminal for controlling switching.

A self-biasing shunt device may be coupled to the first active device at block 404. The self-biasing shunt device may include a second active device having a DC-blocked source terminal and a non-DC blocked drain terminal. The second active device may include a gate terminal, which may be coupled to the DC-blocked source terminal. The gate terminal and the DC-blocked source terminal may be coupled to a local ground terminal. A resistor may be connected between the gate terminal and the local ground terminal, and a capacitor may be connected between the DC-blocked source terminal and the local ground terminal.

FIG. 5 illustrates a flow diagram of some of the operations associated with an example method 500 of using a switch including a shunt device in accordance with various embodiments described herein. It should be noted that although the method 500 is illustrated as a series of sequential steps, the method is not necessarily order dependent. Moreover, methods within the scope of this disclosure may include more or fewer steps than that illustrated in FIG. 5.

According to various embodiments, a first active device may be provided on a signal path between an antenna terminal and a T/R terminal at block 502. Although not illustrated, in some embodiments, one or more additional active devices may be provided in series with the first active device on the signal path between the antenna terminal and the T/R terminal. The active devices may comprise one or more FETs.

A non-DC blocked drain terminal of a second active device of a self-biasing shunt device may be directly coupled to a gate terminal of the first active device at block 504. The self-biasing shunt device may be configured as described herein and may include, for example, a DC-blocked source terminal and a non-DC blocked drain terminal. The gate terminal and the DC-blocked source terminal of the self-biasing shunt device may be coupled to a local ground terminal. A resistor may be connected between the gate terminal and the local ground terminal, and a capacitor may be connected between the DC-blocked source terminal and the local ground terminal.

The antenna terminal may be isolated from the T/R terminal by switching off the first active device at block 506, and a signal on the signal path may be shunted to a local ground terminal coupled to the self-biasing shunt device by switching on the second active device. As described more fully herein, a control signal may be simultaneously provided to the gate terminal of the first active device and to the non-DC blocked drain terminal of the second active device coupled to the gate terminal of the first active device. The control signal may control switching off of the first active device and switching on of the second active device.

Although not illustrated here, the antenna terminal may be coupled to the T/R terminal by switching on the first active device, and by switching off the second active device. In this case, a control signal may also be simultaneously provided to the gate terminal of the first active device and to the non-DC blocked drain terminal of the second active device coupled to the gate terminal of the first active device. The control signal may control switching on of the first active device and switching off of the second active device.

Embodiments of shunt devices, and switches including such shunt devices, described herein may be incorporated into various apparatuses and systems. Shunt devices described herein may be particularly beneficial for switch applications requiring high integration, high performance, and low cost, due at least in part to the elimination of at least one capacitor relative to conventional shunt devices, as described more fully herein.

Figure 6:
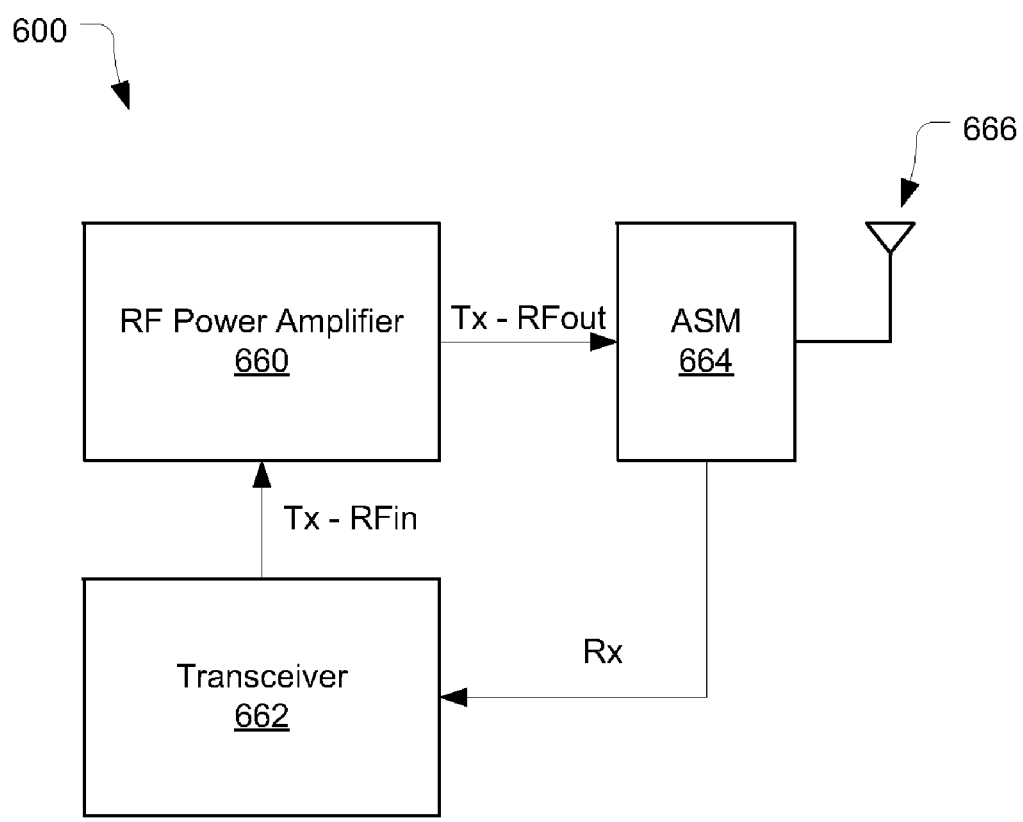
FIG. 6 is a block diagram of a system incorporating a switch including a shunt device in accordance with various embodiments.

A block diagram of an example system 600 is illustrated in FIG. 6. As illustrated, the system 600 includes an RF power amplifier 660. The system 600 may include a transceiver 662 coupled with the RF power amplifier 660 as illustrated.

The RF power amplifier 660 may receive an RF input signal, RFin, from the transceiver 662. The RF power amplifier 660 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 6.

The amplified RF output signal, RFout, may be provided to an antenna switch module (ASM) 664, which effectuates an over-the-air (OTA) transmission of the RF output signal, RFout, via an antenna structure 666. The ASM 664 may also receive RF signals via the antenna structure 566 and couple the received RF signals, Rx, to the transceiver 662 along a receive chain.

The ASM 564 may include one or more shunt devices as described herein. For example, the ASM 664 may include one or more shunt devices including a self-biasing shunt device coupled to a first active device located on a signal path between an antenna terminal and T/R terminal. The shunt device(s) may include a second active device having a DC-blocked source terminal and a non-DC blocked drain terminal, such as the shunt device 226 described herein with reference to FIG. 2.

In various embodiments, the antenna structure 666 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 600 may be any system including power amplification. In various embodiments, the system 600 may be particularly useful for power amplification at high radio frequency power and frequency. For example, the system 600 may be suitable for any one or more of terrestrial and satellite communications, radar systems, and possibly in various industrial and medical applications. More specifically, in various embodiments, the system 600 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
   a positive-voltage controlled switch including a first active device located on a signal path between an antenna terminal and a transmit and/or receive (T/R) terminal; and
   a self-biasing shunt device coupled to the first active device and including a second active device having a DC-blocked source terminal and a non-DC-blocked drain terminal directly coupled to a gate terminal of the first active device.

2. The apparatus of claim 1, further comprising a capacitor between a source terminal of the first active device and the T/R terminal.

3. The apparatus of claim 1, wherein at least one of the first active device and the second active device comprises a field effect transistor.

4. The apparatus of claim 1, further comprising a third active device, wherein the third active device and the first active device are coupled in series and located on the signal path between the antenna terminal and the T/R terminal.

5. The apparatus of claim 1, wherein the self-biasing shunt device further includes a resistor coupled between a gate terminal of the second active device and a local ground terminal, and a capacitor coupled between the DC-blocked source terminal and the local ground terminal.

6. The apparatus of claim 1, wherein the non-DC-blocked drain terminal of the second active device and the gate terminal of the first active device are coupled at a node, and wherein the apparatus further includes a resistor coupled between the node and a control terminal configured to receive a control signal.

7. The apparatus of claim 1, wherein the signal path is a first signal path, wherein the T/R terminal is a first T/R terminal, and wherein the apparatus further comprises a second signal path between the antenna terminal and a second T/R terminal.

8. A system comprising:
   an antenna switch module configured to receive a radio frequency (RF) input signal, the antenna switch module including:
      a positive-voltage controlled switch including a first active device located on a signal path between an antenna terminal and a transmit and/or receive (T/R) terminal; and
      a self-biasing shunt device coupled to the first active device and including a second active device having a DC-blocked source terminal and a non-DC blocked drain terminal directly coupled to a gate terminal of the first active device; and
   a transceiver coupled with the T/R terminal of the antenna switch module and configured to receive the RF input signal.

9. The system of claim 8, wherein the antenna switch module further comprises a third active device, wherein the third active device and the first active device are coupled in series and located on the first signal path between the antenna terminal and the T/R terminal.

10. The system of claim 9, wherein the signal path is a first signal path, wherein the T/R terminal is a first T/R terminal, and wherein the antenna switch module further comprises a second signal path between the antenna terminal and a second T/R terminal.

11. The system of claim 8, wherein the antenna switch module is further configured to effectuate transmission of an RF output signal.

12. The system of claim 11, further comprising an antenna structure coupled with the antennal terminal of the antenna switch module and configured to facilitate the transmission of the RF output signal.

13. The system of claim 8, wherein the system is a radar device, a satellite communication device, a mobile handset, a base station, a broadcast radio, or a television amplifier system.

14. A method of manufacturing a switch comprising:
providing a first active device, of a positive-voltage controlled switch, on a signal path between an antenna terminal and a transmit and/or receive (T/R) terminal;
directly coupling a gate terminal of the first active device to a non-DC blocked drain terminal of a second active device of a self-biasing shunt device; and
coupling a capacitor between a DC-blocked source terminal of the second active device and a local ground terminal.

15. The method of claim 14, further comprising coupling a third active device in series with the first active device on the signal path between the antenna terminal and the T/R terminal.

16. The method of claim 14, wherein the method further comprises coupling a resistor between a gate terminal of the second active device and the local ground terminal.

17. The method of claim 14, further comprising coupling a resistor between a node coupled to a non-DC-blocked drain terminal of the second active device and the gate terminal of the first active device, and coupling the node to a control terminal configured to receive a control signal.

18. A method comprising:
providing a positive-voltage controlled switch including a first active device on a signal path between an antenna terminal and a transmit and/or receive (T/R) terminal;
directly coupling a non-DC-blocked drain terminal of a second active device of a self-biasing shunt device to a gate terminal of the first active device;
isolating the antenna terminal from the T/R terminal by switching off the first active device; and
shunting a signal on the signal path to a local ground terminal coupled via a resistor to the self-biasing shunt device by switching on the second active device.

19. The method of claim 18, further comprising coupling the antenna terminal to the T/R terminal by switching on the first active device, and by switching off the second active device.

20. The method of claim 18, further comprising providing a control signal via another resistor to the gate terminal of the first active device and to the non-DC blocked drain terminal of the second active device, wherein the control signal controls switching off of the first active device and switching on of the second active device.

* * * * *